(12) United States Patent
Hsu et al.

(10) Patent No.: US 7,639,473 B2
(45) Date of Patent: Dec. 29, 2009

(54) CIRCUIT BOARD STRUCTURE WITH EMBEDDED ELECTRONIC COMPONENTS

(75) Inventors: Shih-Ping Hsu, Hsin-Chu (TW); Kan-Jung Chia, Hsin-Chu (TW)

(73) Assignee: Phoenix Precision Technology Corporation, Hsin-Chu ( * ) Notice: Subject to any disclaimer, the term of this patent is extended or adjusted under 35 U.S.C. 154(b) by 137 days.

(21) Appl. No.: 11/925,590

(22) Filed: Oct. 26, 2007

(65) Prior Publication Data

US 2008/0151518 A1 Jun. 26, 2008

(30) Foreign Application Priority Data

Dec. 22, 2006 (TW) .............................. 95148373 A

(51) Int. Cl.
*F23Q 3/00* (2006.01)
(52) U.S. Cl. ...................... 361/260; 361/312; 361/763; 174/260
(58) Field of Classification Search ............... 361/260, 361/306.3, 311, 312, 760, 763, 765; 174/260–262, 174/258
See application file for complete search history.

(56) References Cited

U.S. PATENT DOCUMENTS 5,670,262 A * 9/1997 Dalman ...................... 428/458
6,144,479 A * 11/2000 Lugg et al. .................. 359/267
6,432,497 B2 * 8/2002 Bunyan ...................... 428/40.1
6,784,765 B2 * 8/2004 Yamada et al. .............. 333/193
6,984,453 B2 * 1/2006 Sugimoto et al. ........... 428/469
7,080,446 B2 * 7/2006 Baba et al. ................... 29/832
7,129,571 B2 * 10/2006 Kang .......................... 257/678
7,198,996 B2 * 4/2007 Nakatani et al. ............ 438/184
7,307,852 B2 * 12/2007 Inagaki et al. ............... 361/760
7,361,573 B2 * 4/2008 Takayama et al. .......... 438/455
2007/0034865 A1 * 2/2007 Yukawa ....................... 257/40

* cited by examiner

*Primary Examiner*—Jinhee J Lee
*Assistant Examiner*—Xiaoliang Chen
(74) *Attorney, Agent, or Firm*—Morrison & Foerster LLP

(57) ABSTRACT

A circuit board structure with embedded electronic components includes: a carrier board having an adhesive layer with two surfaces formed with first and second metal oxide layers covered by first and second metal layers and having at least one through hole; at least one semiconductor chip received in the through hole of the carrier board; an adhesive material filling a gap between the through hole and the semiconductor chip so as to secure the semiconductor chip in position to the through hole; a high dielectric material layer formed outwardly on the second metal layer; and at least one electrode board formed outwardly on the high dielectric material layer such that a capacitance component is formed with the second metal layer, high dielectric material layer, and electrode board. Accordingly, the capacitance component is integrated into the circuit board structure.

25 Claims, 4 Drawing Sheets

CIRCUIT BOARD STRUCTURE WITH EMBEDDED ELECTRONIC COMPONENTS

BACKGROUND OF THE INVENTION

1. Field of the Invention

The present invention relates to circuit board structures with embedded electronic components, and more particularly, to a circuit board structure integrated with a capacitance component and a semiconductor chip.

2. Description of the Prior Art

Electronic products nowadays are becoming lighter, thinner and smaller, thus making the semiconductor industry embed electronic components into package substrates so as to conform with the trend of miniaturization. For instance, most semiconductor manufacturers perform a process that involves embedding active components (e.g., semiconductor chips) and passive components (e.g., resistors, capacitors, and inductors) in an alumina ceramic substrate, for example, and then patterning a circuit on the ceramic substrate so as to form a circuit board structure having active/passive component embedded therein. However, owing to their brittleness and low bending strength, ceramic substrates rarely come in thin, large sizes and thereby are limited in use to small modules or packages. Moreover, the prior art discloses embedding passive components in ceramic substrates instead of forming passive components (e.g., capacitance components) directly in substrates.

Accordingly, an issue facing the semiconductor manufacturers and calling for urgent solution involves developing a circuit board structure with embedded electronic components and a fabrication method thereof with a view to solving drawbacks of the prior art as follows: first, a circuit board structure with a ceramic substrate functioning as a carrier element for a semiconductor chip has low bending strength; second, ceramic is unfit for fabrication of large, thin substrates; and third, the prior art does not disclose a method for forming capacitance components in a circuit board directly, which could be more efficient.

SUMMARY OF THE INVENTION

In light of the aforesaid drawbacks of the prior art, it is a primary objective of the present invention to provide a circuit board structure with embedded electronic components, that allows the bending strength of the circuit board structure to be enhanced.

Another objective of the present invention is to provide a circuit board structure with embedded electronic components, that makes the circuit board structure structurally simpler.

In order to achieve the above and other objectives, the present invention discloses a circuit board structure with embedded electronic components. The circuit board structure comprises: a carrier board comprising an adhesive layer having two surfaces respectively attached with first and second metal oxide layers, the first and second metal oxide layers being formed via an oxidation process on the first and second metal layers, wherein the carrier board is formed with at least one through hole; at least one semiconductor chip received in the through hole of the carrier board; an adhesive material filling a gap between the carrier board and the semiconductor chip so as to secure the semiconductor chip in position to the through hole of the carrier board; a high dielectric material layer formed on the second metal layer; and at least one electrode board formed on the high dielectric material layer such that the second metal layer, high dielectric material layer, and electrode board are together formed into a capacitance component.

The first and second metal layers are made of aluminum and subjected to an oxidation process to form the first and second oxide layers made of, for example, aluminum oxide on the first and second metal layers, respectively.

The semiconductor chip has an active surface and a non-active surface opposite to the active surface. The active surface is provided with a plurality of electrode pads. The active surface of the semiconductor chip is positioned at the same side with the second metal oxide layer with respect to the carrier board. A circuit build-up structure is formed on the active surface of the semiconductor chip, high dielectric material layer, and electrode board, and is formed with a plurality of conductive structures for electrical connection with the electrode pads of the semiconductor chip and the electrode board of the capacitance component. Another circuit build-up structure may be further formed on the first metal layer and the non-active surface of the semiconductor chip. The carrier board is formed with at least one plated through hole for electrically connecting the circuit build-up structures.

In another embodiment of the circuit board structure, the active surface of the semiconductor chip is positioned at the same side with the first metal layer with respect to the carrier board. A circuit build-up structure is formed on surfaces of the non-active surface of the semiconductor chip, high dielectric material layer, and electrode board, and is formed with a plurality of conductive structures for electrical connection with the electrode board of the capacitance component. Another circuit build-up structure is formed on the first metal layer and the active surface of the semiconductor chip, and is formed with a plurality of conductive structures for electrical connection with the electrode pads of the semiconductor chip. The carrier board is further formed with at least one plated through hole for electrically connecting the circuit build-up structures.

The circuit build-up structures each comprise a dielectric layer, a circuit layer superimposed on the dielectric layer, and the conductive structures formed in the dielectric layer. The circuit build-up structures are each formed with a plurality of electrical connection pads and covered with a solder mask. A plurality of openings are thus formed in the solder mask for exposing the electrical connection pads of the circuit build-up structures.

Accordingly, a circuit board structure with embedded electronic components disclosed in the present invention is structurally reinforced by the metal layers and metal oxide layers of the carrier board so as to enhance the bending strength of the circuit board structure during subsequent processes. Regarding the carrier board of the present invention, the second metal layer is formed with a high dielectric material layer and an electrode board. It allows the high dielectric material layer, the electrode board and the second metal layer, to form a capacitance component. Therefore, the present invention overcomes various drawbacks of using a ceramic substrate as a carrier board as disclosed in the prior art.

DETAILED DESCRIPTION OF THE PREFERRED EMBODIMENTS

The following specific embodiments are provided to illustrate the present invention. Persons skilled in the art can readily gain insight into other advantages and features of the present invention based on the contents disclosed in this specification.

First Embodiment

FIGS. 1A to 1E are cross-sectional views showing an embodiment of a method for fabricating a circuit board structure with embedded electronic components of the present invention.

Figure 1A:
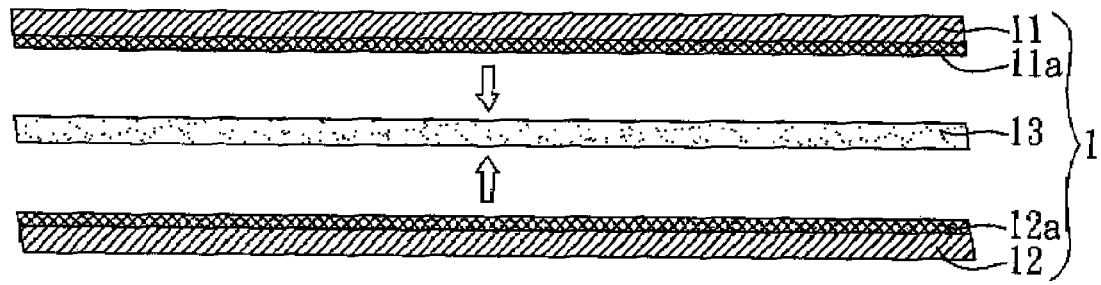
FIGS. 1A to 1E are cross-sectional views showing the first embodiment of a circuit board structure with embedded electronic components of the present invention.

As shown in FIG. 1A, the method comprises: providing a first metal layer 11 and a second metal layer 12, wherein the first and second metal layers 11 and 12 comprise aluminum; performing an oxidation process on the first and second metal layers 11 and 12 so as to form a first metal oxide layer 1a and a second metal oxide layer 12a, such as aluminum oxide, on the first and second metal layers 11 and 12, wherein the first and second metal oxide layers 11a and 12a are formed on one of the surfaces of the first and second metal layers 11 and 12 either by oxidizing both of the surfaces of the first and second metal layers 11 and 12 and then removing one metal oxide layer from one surface of each of the oxidized metal layers by etching, or by performing the oxidation process after forming a release film on one of the surfaces of the first and second metal layers 11 and 12; and combining the first and second metal oxide layers 11a and 12a by an adhesive layer 13, such as a thermosetting resin or a glue, so as to form a carrier board 1.

Figure 1B:
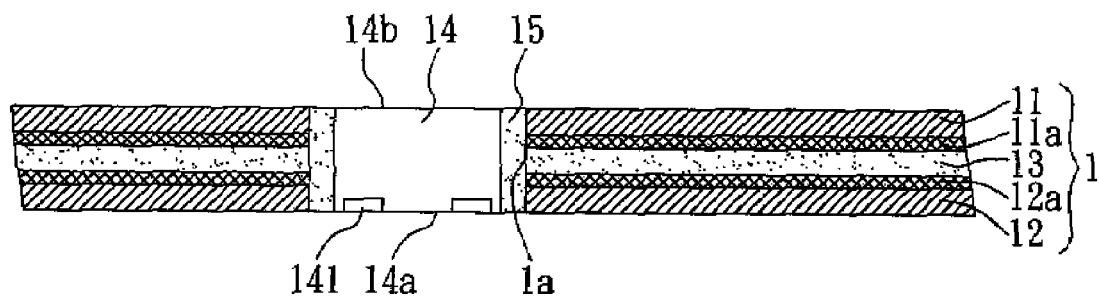

As shown in FIG. 1B, the method further comprises: forming in the carrier board 1 at least one through hole 1a penetrating the carrier board 1 such that a semiconductor chip can be received in the through hole 1a of the circuit board 1 and installing a semiconductor chip 14 in the through hole 1a; and filling a gap between the through hole 1a and the semiconductor chip 14 with an adhesive material 15 so as to secure the semiconductor chip 14 in position in the through hole 1a. The semiconductor chip 14 has an active surface 14a and a non-active surface 14b opposite the active surface 14a. The active surface 14a of the semiconductor chip 14 is provided with a plurality of electrode pads 141 and faces in the same direction as the second metal layer 12 faces.

Figure 1C:
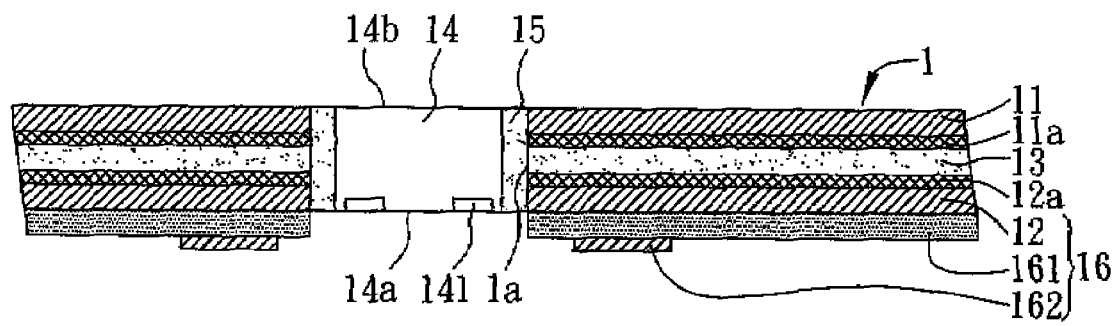

As shown in FIG. 1C, the method further comprises: forming a high dielectric material layer 161 and an electrode board 162 on the second metal layer 12; and forming a capacitance component 16 with the second metal layer 12, the high dielectric material layer 161, and the electrode board 162.

Figure 1D:
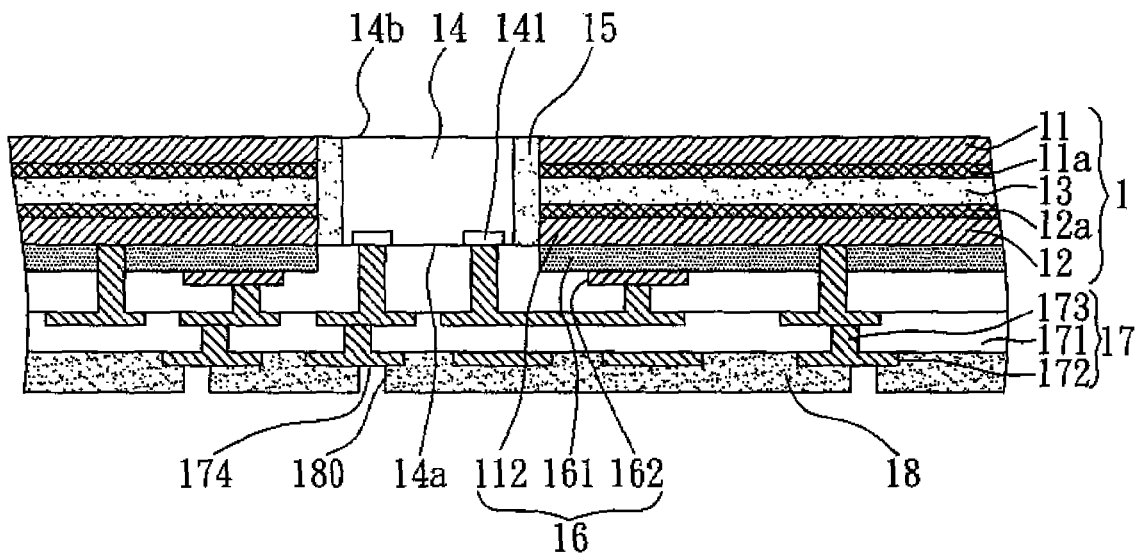

As shown in FIG. 1D, the method further comprises: forming a circuit build-up structure 17 on surfaces of the active surface 14a of the semiconductor chip 14 and the electrode board 162 of the capacitance component 16. The circuit build-up structure 17 comprises a dielectric layer 171, a circuit layer 172 superimposed on the dielectric layer 171, and conductive structures 173 formed in the dielectric layer 171. The conductive structures 173 are electrically connected to the electrode pads 141 of the semiconductor chip 14 and the electrode board 162 of the capacitance component 16. The circuit build-up structure 17 is outwardly provided with a plurality of electrical connection pads 174. The circuit build-up structure 17 is outwardly covered with a solder mask 18. The solder mask 18 is formed with a plurality of openings 180 for exposing the electrical connection pads 174 outwardly provided for the circuit build-up structure 17. The conductive structures 173 formed in the dielectric layer 171 are fully plated conductive vias or conductive vias not fully plated (not shown). The conductive structures 173 and circuit layer 172 formed on the electrode pads 141 of the semiconductor chip 14 can be electrically connected to the capacitance component 16.

Figure 1E:
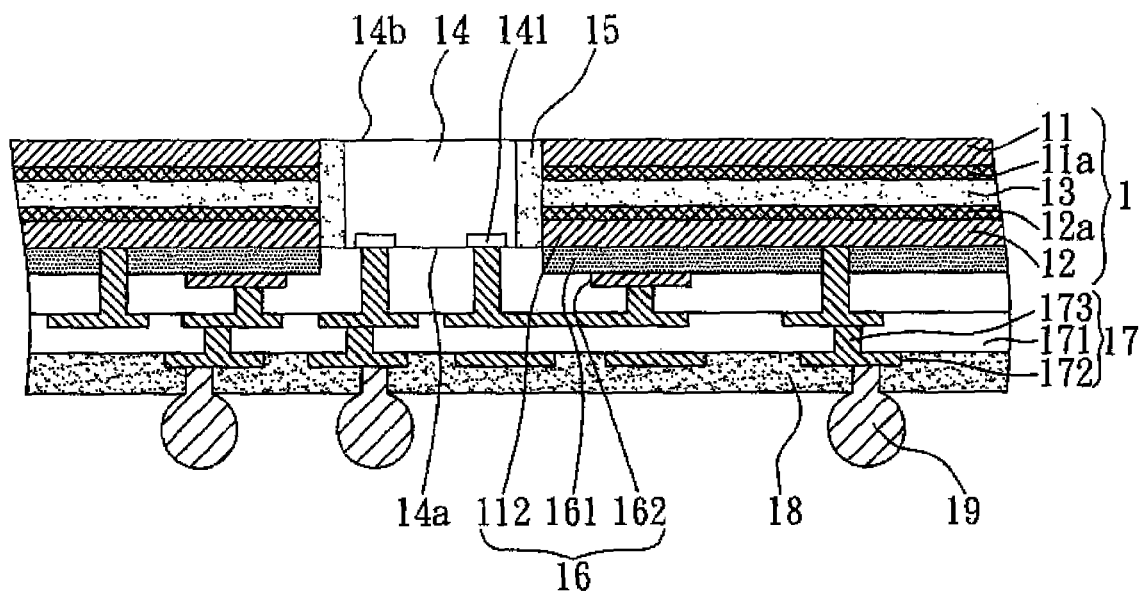

As shown in FIG. 1E, the method further comprises mounting conductive components 19 on the electrical connection pads 174 outwardly provided for the circuit build-up structure 17. The conductive components 19 are solder balls or pins.

In summary, the present invention discloses a circuit board structure with embedded electronic components, comprising a carrier board 1, at least one semiconductor chip 14, an adhesive material 15, a high dielectric material layer 161, and an electrode board 162.

The carrier board 1 comprises an adhesive layer 13 having two opposite surfaces, and first and second metal oxide layers 11a and 12a formed on the two opposite surfaces of the adhesive layer 13 respectively. The first and second metal oxide layers 11a and 12a are formed outwardly with a first metal layer 11 and a second metal layer 12 respectively. The carrier board 1 is formed with and penetrated by at least one through hole 1a.

The semiconductor chip 14 is received in the through hole 1a of the carrier board 1. The semiconductor chip 14 has an active surface 14a and a non-active surface 14b opposite the active surface 14a. The active surface 14a of the semiconductor chip 14 is provided with a plurality of electrode pads 141 and faces in the same direction as the second metal layer 12 faces.

An adhesive material 15 fills a gap between the through hole 1a and the semiconductor chip 14 so as to secure in position the semiconductor chip 14 to the through hole 1a.

The high dielectric material layer 161 and the electrode board 162 formed outwardly on the second metal layer 12 together with the second metal layer 12 itself collectively constitute a capacitance component 16.

As shown in FIG. 1D, the circuit board structure further comprises a circuit build-up structure 17 formed on surfaces of the high dielectric material layer 161, electrode board 162, and active surface 14a of the semiconductor chip 14. The circuit build-up structure 17 comprises a dielectric layer 171, a circuit layer 172 superimposed on the dielectric layer 171, and conductive structures 173 formed in the dielectric layer 171. The conductive structures 173 are electrically connected to the electrode pads 141 of the semiconductor chip 14 and the electrode board 162 of the capacitance component 16. The circuit build-up structure 17 is outwardly provided with a plurality of electrical connection pads 174. The circuit build-up structure 17 is outwardly covered with a solder mask 18. The solder mask 18 is formed with a plurality of openings 180 for exposing the electrical connection pads 174 of the circuit build-up structure 17.

The structural strength of the carrier board 1 is enhanced because of the first and second metal layers 11 and 12 and the first and second metal oxide layers 11a and 12a, so as to prevent deformation from arising in subsequent processing. The capacitance component 16 of the present invention is integrated into the substrate in that the capacitance component 16 is formed with the second metal layer 12, high dielectric material layer 161, and the electrode board 162 outwardly formed on the second metal layer 12.

Second Embodiment

Figure 2:
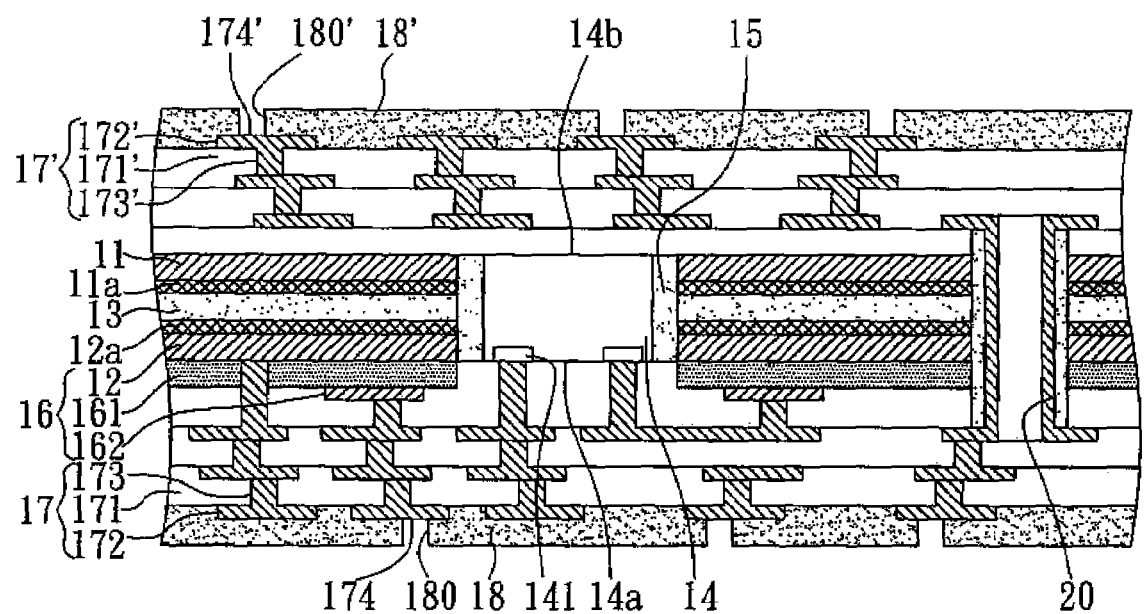
FIG. 2 is a cross-sectional view showing the second embodiment of a circuit board structure with embedded electronic components of the present invention.

FIG. 2 is a cross-sectional view showing the second embodiment of a circuit board structure with embedded electronic components of the present invention.

In this embodiment, in addition to the circuit build-up structure 17, another circuit build-up structure 17' is formed on the non-active surface 14b of the semiconductor chip 14 and the first metal layer 11, and, additionally, the carrier board 1 is formed with and penetrated by at least one plated through hole 20. The plated through hole 20 electrically connects the circuit build-up structures 17 and 17' so as to enhance the electrical function of the circuit board structure.

Third Embodiment

Figure 3:
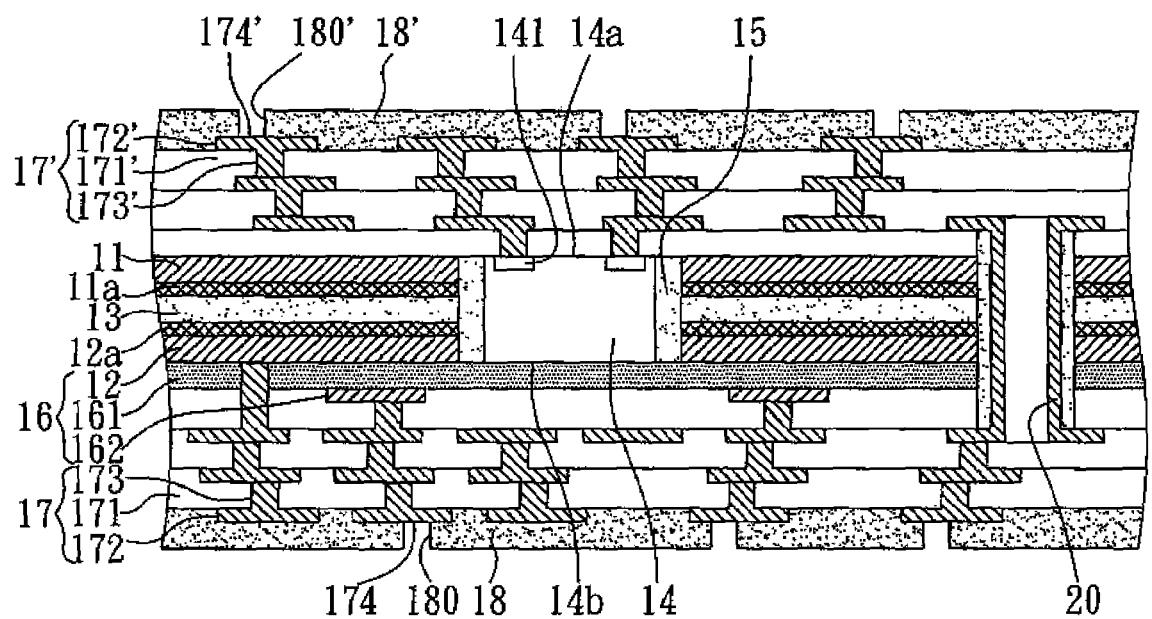
FIG. 3 is a cross-sectional view showing the third embodiment of a circuit board structure with embedded electronic components of the present invention.

FIG. 3 is a cross-sectional view showing the third embodiment of a circuit board structure with embedded electronic components of the present invention.

This embodiment differs from the second embodiment in that the active surface of the semiconductor chip faces in the same direction as the first metal layer faces instead of the second metal layer.

As shown in FIG. 3, the circuit build-up structure 17 is formed on the surfaces of the non-active surface 14b of the semiconductor chip 14 and the high dielectric material layer 161 and electrode board 162 of the capacitance component 16. The circuit build-up structure 17 is formed with the conductive structures 173 for electrical connection with the electrode board 162 of the capacitance component 16. Another circuit build-up structure 17' is formed on the active surface 14a of the semiconductor chip 14 and the first metal layer 11. The circuit build-up structure 17' is formed with conductive structures 173' for electrical connection with the electrode pads 141 of the semiconductor chip 14. The carrier board 1 is formed with and penetrated by at least one plated through hole 20. The plated through hole 20 electrically connects the circuit build-up structures 17 and 17'. The circuit build-up structures 17 and 17' are outwardly provided with a plurality of electrical connection pads 174 and 174'. The circuit build-up structures 17 and 17' are outwardly covered with the solder masks 18 and 18'. A plurality of openings 180 and 180' are formed in the solder masks 18 and 18' for exposing the electrical connection pads 174 and 174' provided outwardly for the circuit build-up structures 17 and 17'.

Unlike the prior art, the present invention discloses a circuit board structure with embedded electronic components, wherein the carrier board 1 is structurally reinforced by the first and second metal layers 11 and 12 of the carrier board 1, and the enhanced structural strength of the carrier board 1 results in enhanced bending strength of the carrier board 1 during subsequent processes. In the present invention, the structure of the circuit board structure is made simpler, because the circuit board structure is directly formed with the capacitance component 16 comprising the high dielectric material layer 161 and electrode board 162 formed outwardly on the second metal layer 12 of the carrier board 1 and the second metal layer 12. Hence, the present invention solves various drawbacks of using a ceramic substrate as a carrier board as disclosed in the prior art.

The aforesaid embodiments merely serve as the preferred embodiments of the present invention. The aforesaid embodiments should not be construed as to limit the scope of the present invention in any way. Hence, many other changes can actually be made in the present invention. It will be apparent to those skilled in the art that all equivalent modifications or changes made to the present invention, without departing from the spirit and the technical concepts disclosed by the present invention, should fall within the scope of the appended claims.

What is claimed is:

1. A circuit board structure with embedded electronic components, the circuit board structure comprising:
   a carrier board comprising an adhesive layer integrated between first and second metal oxide layers, wherein a first metal layer is on the first metal oxide layer, and a second metal layer is on the second metal oxide layer, and wherein the carrier board defines at least one through hole, and the at least one through hole penetrates through the adhesive layer, first and second metal oxide layers, and first and second metal layers;
   at least one semiconductor chip received in the at least one through hole of the carrier board;
   an adhesive material filling a gap between the carrier board and the semiconductor chip so as to secure the semiconductor chip in position to the through hole of the carrier board;
   a high dielectric material layer on the second metal layer; and
   at least one electrode board on the high dielectric material layer such that the second metal layer, high dielectric material layer, and electrode board together are a capacitance component.

2. The circuit board structure of claim 1, wherein the semiconductor chip has an active surface and a non-active surface opposite to the active surface, allowing the active surface to be provided with a plurality of electrode pads and positioned at the same side with the second metal layer with respect to the carrier board.

3. The circuit board structure of claim 2, further comprising a circuit build-up structure formed on the active surface of the semiconductor chip, high dielectric material layer, and electrode board, and having a plurality of conductive structures for electrical connection with the electrode pads of the semiconductor chip and the electrode board of the capacitance component.

4. The circuit board structure of claim 3, wherein the circuit build-up structure comprises a dielectric layer, a circuit layer superimposed on the dielectric layer, and the conductive structures in the dielectric layer.

5. The circuit board structure of claim 3, wherein a plurality of electrical connection pads are on the circuit build-up structure.

6. The circuit board structure of claim 5, further comprising a solder mask covering the circuit build-up structure and defining a plurality of openings exposing the electrical connection pads of the circuit build-up structure.

7. The circuit board structure of claim 5, further comprising a plurality of conductive components mounted on the electrical connection pads.

8. The circuit board structure of claim 3, further comprising another circuit build-up structure on the first metal layer and the non-active surface of the semiconductor chip, wherein the carrier board defines at least one plated through hole electrically connecting the circuit build-up structures.

9. The circuit board structure of claim 8, wherein the another circuit build-up structure comprises a dielectric layer, a circuit layer superimposed on the dielectric layer, and a plurality of conductive structures in the dielectric layer.

10. The circuit board structure of claim 8, wherein a plurality of electrical connection pads are on the another circuit build-up structure.

11. The circuit board structure of claim 10, further comprising a solder mask covering the another circuit build-up structure and defining a plurality of openings exposing the electrical connection pads of the another circuit build-up structure.

12. The circuit board structure of claim 10, further comprising a plurality of conductive components mounted on the electrical connection pads.

13. The circuit board structure of claim 1, wherein the semiconductor chip has an active surface and a non-active surface opposite to the active surface, allowing the active surface to be provided with a plurality of electrode pads and positioned at the same side with the first metal layer with respect to the carrier board.

14. The circuit board structure of claim 13, further comprising a circuit build-up structure on surfaces of the non-active surface of the semiconductor chip, high dielectric material layer, and electrode board, and having a plurality of conductive structures for electrical connection with the electrode board of the capacitance component.

15. The circuit board structure of claim 14, wherein the circuit build-up structure comprises a dielectric layer, a circuit layer superimposed on the dielectric layer, and the conductive structures in the dielectric layer.

16. The circuit board structure of claim 14, wherein a plurality of electrical connection pads are on the circuit build-up structure.

17. The circuit board structure of claim 16, further comprising a solder mask covering the circuit build-up structure and defining a plurality of openings exposing the electrical connection pads of the circuit build-up structure.

18. The circuit board structure of claim 16, further comprising a plurality of conductive components mounted on the electrical connection pads.

19. The circuit board structure of claim 13, further comprising another circuit build-up structure on the first metal layer and the active surface of the semiconductor chip and having a plurality of conductive structures for electrical connection with the electrode pads of the semiconductor chip, wherein the carrier board defines at least one plated through hole for electrically connecting the circuit build-up structures.

20. The circuit board structure of claim 19, wherein the another circuit build-up structure comprises a dielectric layer, a circuit layer superimposed on the dielectric layer, and a plurality of conductive structures in the dielectric layer.

21. The circuit board structure of claim 19, wherein a plurality of electrical connection pads are on the another circuit build-up structure.

22. The circuit board structure of claim 21, further comprising a solder mask covering the another circuit build-up structure and defining a plurality of openings exposing the electrical connection pads of the another circuit build-up structure.

23. The circuit board structure of claim 21, further comprising a plurality of conductive components mounted on the electrical connection pads.

24. The circuit board structure of claim 1, wherein the first and second metal layers are aluminum, and the first and second metal oxide layers are aluminum oxide.

25. The circuit board structure of claim 1, wherein the adhesive layer is one of a thermosetting resin and a glue.

* * * * *